(12) United States Patent
Hendrikx et al.

(10) Patent No.: US 9,354,520 B2
(45) Date of Patent: *May 31, 2016

(54) METHOD OF MAKING A LITHOGRAPHIC PRINTING PLATE

(71) Applicant: AGFA GRAPHICS NV, Mortsel (BE)

(72) Inventors: Peter Hendrikx, Mortsel (BE); Jan Sinnesael, Mortsel (BE); Roberto Carbonini, Mortsel (BE); Sam Verbrugghe, Mortsel (BE)

(73) Assignee: AGFA GRAPHICS NV, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 14/654,598

(22) PCT Filed: Jan. 7, 2014

(86) PCT No.: PCT/EP2014/050122
§ 371 (c)(1),
(2) Date: Jun. 22, 2015

(87) PCT Pub. No.: WO2014/108385
PCT Pub. Date: Jul. 17, 2014

(65) Prior Publication Data
US 2015/0355548 A1    Dec. 10, 2015

Related U.S. Application Data

(60) Provisional application No. 61/752,462, filed on Jan. 15, 2013.

(30) Foreign Application Priority Data

Jan. 11, 2013 (EP) ..................................... 13150972

(51) Int. Cl.
*G03F 7/30* (2006.01)
*G03F 7/32* (2006.01)
*G03F 7/20* (2006.01)

(52) U.S. Cl.
CPC .. *G03F 7/32* (2013.01); *G03F 7/20* (2013.01); *G03F 7/3042* (2013.01); *G03F 7/3064* (2013.01); *G03F 7/3071* (2013.01)

(58) Field of Classification Search
CPC .................................................... B41C 2210/04
See application file for complete search history.

(56) References Cited

U.S. PATENT DOCUMENTS

2006/0153561 A1    7/2006    Ginther

FOREIGN PATENT DOCUMENTS

| BE | WO 2013034474 A1 * | 3/2013 | ............ G03F 7/3071 |
|---|---|---|---|
| EP | 1 696 274 A2 | 8/2006 | |
| EP | 1 755 002 A2 | 2/2007 | |
| EP | 1 788 444 A1 | 5/2007 | |
| WO | 2013/034474 A1 | 3/2013 | |

OTHER PUBLICATIONS

Official Communication issued in International Patent Application No. PCT/EP2014/050122, mailed on Mar. 28, 2014.
Vervloet et al., "Method of Making a Lithographic Printing Plate," U.S. Appl. No. 14/342,684, filed Mar. 4, 2014.

* cited by examiner

*Primary Examiner* — Chanceity Robinson
(74) *Attorney, Agent, or Firm* — Keating & Bennett, LLP

(57) ABSTRACT

A method of making a lithographic printing plate includes the steps of a) image-wise exposing a lithographic printing plate precursor, including a support including a hydrophilic surface or a hydrophilic layer and, thereon, a light or heat sensitive coating including a photopolymerizable composition, b) processing the precursor, consecutively, with a first solution and a second solution, to remove the coating from the support in the non-printing areas, wherein the first and second solutions are provided by a cascade system, the second solution overflows into the first solution and the first solution overflows into a container to be treated as waste, and the second solution is regenerated by adding a replenishing solution or a mixture of replenishing solutions at a rate of at least 5 ml/m$^2$ of treated precursor and at most 100 ml/m$^2$ of treated precursor.

10 Claims, No Drawings

US 9,354,520 B2

METHOD OF MAKING A LITHOGRAPHIC PRINTING PLATE

CROSS-REFERENCE TO RELATED APPLICATIONS

This application is a 371 National Stage Application of PCT/EP2014/050122, filed Jan. 7, 2014. This application claims the benefit of U.S. Provisional Application No. 61/752,462, filed Jan. 15, 2013, which is incorporated by reference herein in its entirety. In addition, this application claims the benefit of European Application No. 13150972.1, filed Jan. 11, 2013, which is also incorporated by reference herein in its entirety.

BACKGROUND OF THE INVENTION

1. Field of the Invention

The present invention relates to a method for making a lithographic printing plate whereby a lithographic printing plate precursor is image-wise exposed and developed in a first and second developing solution, provided in a cascade system.

2. Description of the Related Art

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green or red light (i.e. wavelength range between 450 and 750 nm), for violet light (i.e. wavelength range between 350 and 450 nm) or for infrared light (i.e. wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of platesetters operating at shorter wavelength. More specifically, semiconductor lasers emitting from 350 to 450 nm have been realized using an InGaN material. An infrared laser diode emitting around 830 nm or a Nd-YAG laser emitting around 1060 nm can also be used.

After image-wise exposure the printing plate precursors are processed with a developing solution to remove the coating from the support at non-printing area, revealing the underlying hydrophilic surface of the substrate. These non-printing areas are the non-exposed areas for negative-working printing plate precursors and the exposed areas for positive-working printing plate precursors. The coating in the non-exposed areas for negative-working printing plate precursors is not hardened and the coating in the exposed areas for positive-working printing plate precursors has an increased solubility in the developer than in the non-exposed areas. The most common way to remove the coating in the non-printing areas is to contact the image-wise exposed precursor with a developing solution. The developing solution, hereinafter also referred to as developer, can be an aqueous solution or a solvent based solution. Typically, the developer is an aqueous alkaline solution or a gum solution which can be used for developing and gumming the plate simultaneously in one single step.

During processing the developer becomes loaded with components of the coating that have been removed during development and the amount of material in the developer increases as more precursors are developed. Due to the increasing amount of material in the developer the activity of the developer decreases resulting in a changed ability to remove the non-printing areas of the image-wise exposed precursors. This means that, as more precursors are developed, precursors are not developed in the same way, resulting in changed lithographic properties of the printing plates.

It is important for a high-quality printing platemaking system that the lithographic properties are as much as possible at a constant level for each processed plate. This means that also when starting a developing process with fresh developer, the activity of the developer has a constant activity level or reaches a constant activity level after developing a limited number of plates.

SUMMARY OF THE INVENTION

It is an object of the present invention to provide a method for making a lithographic printing plate wherein the developing solution has an improved stability of activity level during processing. A preferred embodiment is realised by the method defined below, having the specific feature that the image-wise exposed lithographic printing plate precursor is developed with a first developing solution, consecutively with a second developing solution, wherein both solutions are provided in a cascade system and are circulated respectively by a first and second liquid conveying system, wherein the second solution is regenerated by adding a replenishing solution or a mixture of replenishing solutions at a rate of at least 5 ml/m$^2$ and at most 100 ml/m$^2$, and wherein the first solution, present in the first liquid conveying system, has a volume of at least Vmin and at most Vmax as respectively defined by formula 1 and formula 2.

Since the second solution is regenerated by adding small amounts of regenerator wherein the second solution overflows into the first solution and the first solution further overflows into a container to be treated as waste, the method has an economical advantage of using low amounts of solution for developing and an ecological advantage of generating only small amounts of waste liquid.

Other specific embodiments of the invention are defined below.

DETAILED DESCRIPTION OF THE PREFERRED EMBODIMENTS

In accordance with a preferred embodiment of the present invention, there is provided a method of making a lithographic printing plate comprising the steps of:

a) image-wise exposing a lithographic printing plate precursor, comprising a support having a hydrophilic surface or which is provided with a hydrophilic layer and, thereon, a light or heat sensitive coating comprising a photopolymerisable composition, b) processing said precursor with a first solution, consecutively with a second solution, thereby removing the coating from the support at non-printing areas, wherein said first and second solutions are provided by a cascade system, wherein said second solution overflows into said first solution and said first solution overflows into a container to be further treated as waste, wherein said second solution is regenerated by adding a replenishing solution or a mixture of replenishing solutions at a rate of at least 5 ml/m2 of treated precursor and at most 100 ml/m2 of treated precursor, wherein said first and second solutions are circulated respectively by a first and second liquid conveying system, wherein the first solution present in said first liquid conveying system has a volume of at least Vmin and at most Vmax respectively defined by formula 1 and formula 2, $V\text{min}=[A+(\text{processing width}/0.95\text{ m})]\cdot\text{liter}$ (formula 1)

$V\text{max}=[B+(\text{processing width}/0.95\text{ m})]\cdot\text{liter}$ (formula 2)

wherein Vmin and Vmax represent respectively the minimum and maximum volume present in said first liquid conveying system, each of them expressed in liter, wherein A and B represents a constant value of respectively 2 and 15, and wherein said processing width represents the width, expressed in m, inside the processing unit, perpendicular to the processing direction, which is available for processing plate precursors in a uniform way across their width.

Light or Heat Sensitive Coating

In a preferred embodiment of the present invention, the printing plate precursor is image-wise exposed off-press by a platesetter, i.e. a laser exposure apparatus suitable for image-wise exposing a precursor. The precursor used is negative-working, wherein the light or heat sensitive coating is hardened at the exposed areas. Here, "hardened" means that the coating becomes insoluble or non-dispersible for the developing solution.

In a preferred embodiment of the present invention, the light or heat sensitive coating on said support comprises an image-recording layer and, optionally, an intermediate layer, between said support and said image-recording layer. The light or heat sensitive coating may also comprise a top layer, on top of said light or heat sensitive coating. The light or heat sensitive coating on said support comprises a photopolymerisable composition wherein these hardened coating areas may be achieved through polymerization and/or crosslinking of the coating. The photopolymerisable composition comprises a polymerisable compound, a polymerization initiator and a binder, and optionally an adhesion promoting compound. The polymerisable compound, the polymerization initiator and the binder are preferably present in said image-recording layer. The adhesion promoting compound can be present in said image-recording layer or in said intermediate layer or in both layers.

The polymerizable compound can be an ethylenically unsaturated compound, having at least one terminal ethylenic group, hereinafter also referred to as "free-radical polymerizable monomer", and said initiator is a compound, capable of generating free radical, optionally in the presence of a sensitizer, upon exposure, hereinafter said initiator also referred to as "free radical initiator". Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality. Any free radical initiator capable of generating free radical directly or in the presence of a sensitizer upon exposure can be used as a free radical initiator. Preferably, a hexaaryl-bisimidazole (HABI; dimer of triaryl-imidazole) compound may be used as a free radical photopolymerization initiator. The polymerizable compound can also be a compound comprising an epoxy or vinyl ether functional group and the initiator to be used for this type of polymerisable compound is a Bronsted acid generator capable of generating free acid, optionally in the presence of a sensitizer, upon exposure, hereinafter said initiator also referred to as "cationic photo-initiator" or "cationic initiator".

The adhesion promoting compound is a compound capable of interacting with said support, preferably a compound having an addition-polymerizable ethylenically unsaturated bond and a functional group capable of interacting with the support, more preferably a functional group capable of interacting with a grained and anodised aluminium support. Under "interacting" is understood each type of physical and/or chemical reaction or process whereby, between the functional group and the support, a bond is formed which can be a covalent bond, an ionic bond, a complex bond, a coordinate bond or a hydrogen-bridge bond, and which can be formed by an adsorption process, a chemical reaction, an acid-base reaction, a complex-forming reaction or a reaction of a chelating group or a ligand. The adhesion promoting compound may be selected from at least one of the low molecular weight compounds or polymeric compounds as described in EP-A 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19.

The photopolymerizable composition may also comprise a co-initiator. Typically, a co-initiator is used in combination with a free radical initiator and/or cationic initiator. Particular co-initiators for use in the photopolymer coating are disclosed in U.S. Pat. Nos. 6,410,205, 5,049,479, EP 1079276, EP 1369232, EP 1369231 EP 1341040, US 2003/0124460, EP 1241002, EP 1288720 and in the reference book including the cited references: Chemistry & Technology UV & EB formulation for coatings, inks & Paints—Volume 3—Photoinitiators for Free Radical and Cationic Polymerisation by K.K. Dietliker—Edited by P. K. T. Oldring—1991—ISBN 0 947798161.

The photopolymerizable composition may also comprise an inhibitor. Particular inhibitors for use in the photopolymer coating are disclosed in U.S. Pat. No. 6,410,205, EP 1288720 and the unpublished patent application EP-A 04101955, filed on May 6, 2004.

The photopolymerizable composition may also comprise a binder. The binder can be selected from a wide series of organic polymers. Compositions of different binders can also be used. Useful binders include for example chlorinated polyalkylene (in particular chlorinated polyethylene and chlorinated polypropylene), polymethacrylic acid alkyl esters or alkenyl esters (in particular polymethyl (meth)acrylate, polyethyl (meth) acrylate, polybutyl (meth) acrylate, polyisobutyl (meth)acrylate, polyhexyl (meth)acrylate, poly(2-ethylhexyl) (meth)acrylate and polyalkyl (meth)acrylate copolymers of (meth) acrylic acid alkyl esters or alkenyl esters with other copolymerizable monomers (in particular with (met) acrylonitrile, vinyl chloride, vinylidene chloride, styrene and/or butadiene), polyvinyl chloride (PVC, vinylchloride/(meth) acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly (meth)acrylonitrile, (meth)acrylonitrile/styrene copolymers, (meth) acrylamide/alkyl (meth)acrylate copolymers, (meth)acrylonitrile/butadiene/styrene (ABS) terpolymers, polystyrene, poly(α-methylstyrene), polyamides, polyurthanes, polyesters, methyl cellulose, ethylcellulose, acetyl cellulose, hydroxy-($C_1$-$C_4$-alkyl)cellulose, carboxymethyl cellulose, polyvinyl formal and polyvinyl butyral. Typical binders are polymers having vinylcaprolactam, vinylpyrrolidone or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from $C_4$ to $C_{30}$. Other useful binders are binders containing carboxyl groups, in particular copolymers containing monomeric units of α,β-unsaturated carboxylic acids or monomeric units of α,β-unsaturated dicarboxylic acids (preferably acrylic acid, methacrylic acid, crotonic acid, vinylacetic acid, maleic acid or itaconic acid). By the term "copolymers" are to be understood in the context of the present invention as polymers containing units of at least 2 different monomers, thus also terpolymers and higher mixed polymers. Particular examples of useful copolymers are those containing units of (meth) acrylic acid and units of alkyl (meth)acrylates, allyl (meth) acrylates and/or (meth)acrylonitrile as well as copolymers containing units of crotonic acid and units of alkyl (meth) acrylates and/or (meth)acrylonitrile and vinylacetic acid/ alkyl (meth)acrylate copolymers. Also suitable are copolymers containing units of maleic anhydride or maleic acid monoalkyl esters.

The photopolymerisable composition may further comprise a surfactant to allow or enhance the developability of the coating, a sensitizer, a colorant, and a top layer. The top layer may act as an oxygen barrier layer, present on top light or heat sensitive coating of the precursor. Preferred binders which can be used in the top layer are polyvinyl alcohol and the polymers disclosed in EP-A-3103498, filed on Sep. 22, 2003, U.S. Pat. No. 6,410,205 and EP 1 288 720, including the cited references in these patents and patent applications. The most preferred binder for the top layer is polyvinylalcohol. The polyvinylalcohol has preferably a hydrolysis degree ranging between 74 mol % and 99 mol %.

The light or heat sensitive coating may be applied on the support by any coating technique known in the art. After applying the coating, the applied layer(s) are dried as commonly known in the art.

Support

A particularly preferred lithographic support is an electrochemically grained and anodized aluminum support. Graining an anodizing of aluminum supports is well known. The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m$^2$ of $Al_2O_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

The anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent. The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

More details of preferred embodiments of the base layer can be found in e.g. EP-A 1 025 992.

Exposure

The image-wise exposing step is carried out off-press in a platesetter, i.e. an exposure apparatus suitable for image-wise exposing the precursor by a laser such as a laser diode, emitting around 830 nm, a Nd:YAG laser, emitting around 1060 nm, a violet laser, emitting around 400 nm, or a gas laser such as an Ar laser, or by a digitally modulated UV-exposure, e.g. by digital mirror devices, or by a conventional exposure in contact with a mask. Lasers emitting near infrared radiation having a wavelength in the range from about 700 to about 1500 nm are e.g. a semiconductor laser diode, a Nd:YAG or a Nd:YLF laser, are used. A lithographic image can be obtained upon image-wise exposure of the printing plate precursor with infrared radiation having an energy density, measured at the surface of the precursor, of 250 $mJ/cm^2$ or less, more preferably of 150 $mJ/cm^2$ or less, most preferably of 100 $mJ/cm^2$ or less. With a useful lithographic image on the printing plate 2% dots (at 200 lpi) are perfectly visible on at least 1 000 prints on paper.

Preheat

After this image-wise exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step is typically used to enhance or to speed-up the polymerization and/or crosslinking reaction.

In another embodiment of the present invention, the precursor is not preheated after the image-wise exposing step.

Processing

Subsequently to the imaging step or the preheat step, when a preheat step is present, the plate precursor is treated, i.e. developed wherein a developing solution is applied to the coating of the precursor whereby the soluble coating areas are removed from the support revealing the hydrophilic surface of the support.

The developing solution can be an aqueous solution or a solvent based solution. Typically, an aqueous alkaline solution can be used in the processing of lithographic printing plate precursors.

The term aqueous includes water or mixtures of water with water-miscible organic solvents such as alcohols, e.g. methanol, ethanol, 2-propanol, butanol, iso-amyl alcohol, octanol, cetyl alcohol, benzyl alcohol, phenoxy propanol, etc.; glycols, e.g. ethylene glycol; glycerine; N-methyl pyrrolidone; methoxypropanol; and ketones, e.g. 2-propanone and 2-butanone; etc. The water-miscible organic solvent may be present in these mixtures of at most 50% by weight, preferably less than 20% by weight, more preferably less than 10% by weight, most preferably no organic solvent is present in the aqueous solution. The aqueous solution may further comprise a compound solubilized or dispersed in water or a mixture of water and a water-miscible solvent. Such compounds may be selected from the compounds of the gum solution as described below.

Currently, most commercial lithographic plates require an additional gumming process after the exposed plate is developed and before it is put on the press, in order to protect the plate from contamination, e.g. by oxidation, fingerprints, fats, oil or dust, or from damaging, e.g. by scratches during handling of the plate.

In a preferred embodiment of the present invention, the lithographic printing plate precursors are processed with a gum solution only. The development with a gum solution has the additional benefit that, due to the remaining gum on the plate in the non-exposed areas, an additional gumming step is not required to protect the surface of the support in the non-printing areas. As a result, the precursor is processed and gummed in one single step and the obtained lithographic image on the plate will not be affected by ambient daylight or by contamination. In the printing step, the plate is mounted on the plate cylinder of the printing press and the printing process is started.

The Gum Solution

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.005 and 20 $g/m^2$ of the surface protective compound, more preferably between 0.010 and 10 $g/m^2$, most preferably between 0.020 and 5 $g/m^2$.

In the present description, all concentrations of compounds present in the gum solution are expressed as percentage by weight (wt. % or % w/w) relative to the ready-to-use gum solution, unless otherwise indicated. A gum solution may be normally supplied as a concentrated solution which is diluted by the end user with water to a ready-to-use gum solution before use according to the instructions of the supplier, usually 1 part of the gum is diluted with 1 part to 10 parts of water.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic surfactants or nonionic surfactants or zwitterionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalenesulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-dinaphtalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers, polyoxyethylene alkylnaphthyl ethers and poloxyethylene-polyoxypropylene block polymers. Further, fluorinic and siliconic anionic and nonionic surfactants may be similarly used.

Suitable example of the zwitter-ionic surfactants include Raluphon DCH (i.e. coco alkyl, about 53% C12).

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30 wt. %, more preferably from 0.05 to 20 wt. %.

According to a preferred embodiment of the present invention the gum solution has a pH-value preferably between 3 and 9, more preferably between 4.5 and 8.5, most preferably between 5 and 7. The pH of the gum solution is usually adjusted with a mineral acid, an organic acid or an inorganic salt in an amount of from 0.01 to 15 wt. %, preferably from 0.02 to 10 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

The gum solution further comprises preferably an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

In accordance with another embodiment of the present invention, the gum solution as developer in the processing of the plate precursor comprises preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 3 and 9, more preferably between 4 and 8, most preferably between 5 and 7.

Besides the foregoing components, a wetting agent such as ethylene glycol, propylene glycol, triethylene glycol, tripropylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 5 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably a silicone anti-foaming agent. Among these anti-foaming agents, either an emulsion dispersion type or solubilized type anti-foaming agent may be used. The proper amount of such an anti-foaming agent to be added is from 0.001 to 3.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of e.g. between 1.7 and 5 mPa·s, by adding viscosity increasing compounds, such as poly(ethylene oxide) or polyvinylalcohol, e.g. having a molecular weight between $10^4$ and $10^7$. Such compounds can be present in a concentration of 0.01 to 10 g/l.

A baking gum has a similar composition as described above, with the additional preference towards compounds that do not evaporate at the usual bake temperatures. Baking gum solutions or baking gumming solutions can be aqueous solutions of sodium dodecyl phenoxy benzene disulphonate, alkylated naphthalene sulphonic acid, sulphonated alkyl diphenyl oxide, methylene dinaphthalene sulphonic acid, etc. Other gumming solutions contain a hydrophilic polymer component and an organic acid component. Still other baking gumming solutions contains the potassium salt of the hydroxyethylidene diphosphonic acid. Still other baking gumming solutions contain a sulphosuccinamate compound and phosphoric acid.

The contact angle between the baking gum solution and the plate is preferably lowered by adding at least one surfactant. Preferred surfactants are non-ionic polyglycols and perfluorated aliphatic polyester acrylates.

In another embodiment the baking gumming solutions comprises (a) water, (b) at least one hydrophilic polymer and (c) at least one component selected from the group consisting of water soluble organic acids comprising at least two acid functions and being selected form the group consisting of a benzene carboxylic acid, a benzene sulphonic acid, a benzene phosphonic acid, an alkane phosphonic acid and water soluble salts thereof. The mentioned compounds (b) and (c) which are dissolved in the aqueous solution are such that they do not evaporate at the customary baking temperatures. The protective layer which is formed remains water-soluble, even after baking, and can be readily removed without damaging the printing plate. Component (b) comprises in particular the following hydrophilic polymers: N-polyvinyl-pyrrolidone, polyvinylmethylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol. Component (c) comprises in particular: benzene disulphonic acids, benzene polycarboxylic acids having from 3 to 6 carboxyl groups, alkane diphosphonic acids which having from 1 to 3 carbon atoms in the alkane group, carboxyl group containing alkane diphosphonic acids which have from 5 to 9 carbon atoms in the alkane group, and/or one of the water-soluble salts of these acids (preferably alkali metal salts or ammonium salts). Specific examples of component (c) include benzene-1,3-disulphonic acid, benzene-1,2,4-tricarboxylic acid (trimellitic acid), benzene 1,2,4,5-tetracarboxylic acid (pyromellitic acid), benzene hexacarboxylic acid (mellitic acid), methane diphosphonic acid (diphosphono methane), 4,4-diphosphono-heptane-1,7-dioic acid (3,3-diphosphone-pimeic acid), and the sodium salts of these acids. In other embodiments the baking gumming solution for use can additionally contain hydroxy-polycarboxylic acids, such as citric acid and/or the salts thereof, water soluble alkanediols having at least 4 carbon atoms, such as hexanediol-(1,6) and surfactants (preferably anionic or non-ionic surfactants) such as alkyl aryl sulphonates, alkyl phenol ether sulphonates and a natural surfactant (e.g. Saponin). Specific examples of suitable baking gum solutions, ingredients and concentrations thereof, can be found in e.g. EP-A 222 297, EP-A 1 025 992, DE-A 2 626 473 and U.S. Pat. No. 4,786,581.

Processing Method

In accordance with a preferred embodiment of the present invention, the image-wise exposed precursor is developed with a first solution, consecutively with a second solution, thereby removing the coating from the support at the non-printing areas. These two solutions are provided by a cascade system, wherein the second solution overflows into the first solution and said first solution overflows into a container to be further treated as waste or to be further treated by filtration, decantation or centrifugation or the like such that it can be regenerated, at least partially, as developing solution and/or replenishing solution.

The first and second solutions are circulated respectively by a first and second liquid conveying system. Each of these liquid conveying systems comprises a bath, a pump and a set of pipes to circulate the solution. Each of these solutions is brought into contact with the image-wise exposed precursor by a spraying, jetting, dipping or coating technique, including spin coating, roll coating, slot coating or gravure coating, in an automatic apparatus. The spraying, jetting, dipping or coating techniques are preferred, spraying or jetting are more preferred.

During the processing, the coating of the precursor is preferably rubbed and/or brushed with at least one roller while applying each of the first and second solution to the coating. Each of the first and second solution is provided with a bath wherein the solution is present and wherein the solution which is applied on the precursor can be collected and conducted to the pump for circulation and to be used several times to develop the precursor.

The first and second solutions used in the developing step have preferably a temperature ranging between 15° C. and 85° C., more preferably between 18° C. and 65° C., most preferably between 20° C. and 55° C.

In accordance with a preferred embodiment of the present invention, the first solution present in the first liquid conveying system has a volume of at least Vmin and at most Vmax respectively defined by formula 1 and formula 2, $$V\text{min}=[A+(\text{processing width}/0.95\text{ m})]\cdot\text{liter} \quad \text{(formula 1)}$$

$$V\text{max}=[B+(\text{processing width}/0.95\text{ m})]\cdot\text{liter} \quad \text{(formula 2)}$$

wherein Vmin and Vmax represent respectively the minimum and maximum volume present in said first liquid conveying system, each of them expressed in liter, wherein A and B represents a constant value of respectively 2 and 15, and wherein said processing width represents the width, expressed in m, inside the processing unit, perpendicular to the processing direction, which is available for processing plate precursors in a uniform way across their width. In a preferred embodiment of the present invention, the value of B is 10, more preferably 8, most preferably 6.

In accordance with a preferred embodiment of the present invention, the second solution is regenerated by adding a replenishing solution or a mixture of replenishing solutions. It is important that the amount of added replenishing solution, added to the second solution has to be small in order to limit the amount of waste developer, produced during processing. Therefore, the rate of replenishing is at least 5 ml of the total amount of replenishing solution or replenishing solutions per $m^2$ of treated precursor and at most 100 ml of the total amount of replenishing solution or replenishing solutions per $m^2$ of treated precursor, preferably at least 20 ml/$m^2$ and at most 85 ml/$m^2$, more preferably at least 50 ml/$m^2$ and at most 75 ml/$m^2$.

In a preferred embodiment of the present invention, the second solution is regenerated by a replenishing solution having the same composition as the starting second solution. In another embodiment of the present invention, the second solution is regenerated by a replenishing solution having a composition with a higher concentration of the active components as present in the starting second solution. In another embodiment, the second solution is regenerated by a mixture of replenishing solutions. Such a mixture of replenishing solutions may comprise at least one solution wherein only one or two or three active components of the starting second solution composition is (are) present, optionally in a different concentration than present in the starting second solution, the other solution or solutions of the mixture may comprise another active component or components than present in the first replenishing solution, optionally in a different concentration than present in the starting second solution. When a mixture of replenishing solutions is used, one of the replenishing solutions may be water.

The addition of replenishing solution, i.e. the type and the amount of replenishing solution, may be regulated by the measurement of at least one of the following parameters such as the number and area of plate precursor developed, the time period of developing, the volume in each developing bath (minimum and maximum level), the viscosity (or viscosity increase) of the solution, the pH (or pH change) of the solution, the density (or density increase) of the solution and the conductivity (or conductivity increase) of the solution, or a combination of at least two of them, preferably area of plate precursor developed. The density (or density increase) of the solution can be measured with a PAAR densitymeter. When the addition of replenishing solution is regulated by measurement of a parameter, the replenisher can be added continuously or in batch form when a predetermined threshold value of the parameter is reached or is crossed. The size of the added batch at each time depends on the predetermined threshold value. In an embodiment of the present invention, this measured parameter is the number of square meters of precursor processed and a predetermined amount of replenisher is added in batch form each time after processing of a fixed area of precursor. This fixed area of processed precursor is a value preferably ranging between 0.5 and 20 $m^2$ of processed precursor, more preferably between 0.8 and 10 $m^2$ of processed precursor, most preferably between 1 and 5 $m^2$ of processed precursor.

The precursor is firstly developed with the first solution and then consecutively with the second solution. Hereby, the most of the soluble coating parts of the precursor are removed with the first solution and the removed material accumulates in the first solution, resulting in a change in developing activity of the solution. Due to the addition of replenishing solution into the second solution and due to the overflow of second solution, in cascade with the first solution, the concentration of removed material in the first solution reaches a constant level. It is important that, when starting with a fresh developing solution, the number of plates to be processed in order to obtain this constant level of concentration of removed material is as small as possible, because a change in developing activity may result in different lithographic properties. Therefore, the volume of the first solution present in the first liquid conveying system has to be as small as possible. In accordance with a preferred embodiment of the present invention, this volume is at least Vmin and at most Vmax as respectively defined by formula 1 and formula 2, $$V\text{min}=[A+(\text{processing width}/0.95\text{ m})]\cdot\text{liter} \quad \text{(formula 1)}$$

$$V\text{max}=[B+(\text{processing width}/0.95\text{ m})]\cdot\text{liter} \quad \text{(formula 2)}$$

wherein Vmin and Vmax represent respectively the minimum and maximum volume present in said first liquid conveying system, each of them expressed in liter, wherein A and B represents a constant value of respectively 2 and 15, preferably respectively 2 and 10, more preferably respectively 2 and 8, most preferably respectively 2 and 6, and wherein said processing width represents the width, expressed in m, inside the processing unit, perpendicular to the processing direction, which is available for processing plate precursors in a uniform way across their width.

In another embodiment of the present invention, the volume of the second solution present in the second liquid conveying system has a volume of at least Vmin and at most Vmax respectively defined by formula 3 and formula 4, $$V\text{min}=[A'+(\text{processing width}/0.95\text{ m})]\cdot\text{liter} \quad \text{(formula 3)}$$

$$V\text{max}=[B'+(\text{processing width}/0.95\text{ m})]\cdot\text{liter} \quad \text{(formula 4)}$$

wherein Vmin and Vmax represent respectively the minimum and maximum volume present in said second liquid conveying system, each of them expressed in liter, wherein A' and B' represents a constant value of respectively 2 and 15, preferably respectively 2 and 10, more preferably respectively 2 and 8, most preferably respectively 2 and 6, and wherein said processing width represents the width, expressed in m, inside the processing unit, perpendicular to the processing direction, which is available for processing plate precursors in a uniform way across their width. In another preferred embodiment of the present invention, the volume of the second solution present in the second liquid conveying system is the same as the volume of the first solution present in the first liquid conveying system.

The first solution may be regenerated by adding a replenishing solution or a mixture of replenishing solutions. It is important that the amount of added replenishing solution, added to the first solution has to be small in order to limit the amount of waste developer, produced during processing. Therefore, the rate of replenishing is at least 5 ml of the total amount of replenishing solution or replenishing solutions per $m^2$ of treated precursor and at most 100 ml of the total amount of replenishing solution or replenishing solutions per $m^2$ of treated precursor, preferably at least 20 ml/$m^2$ and at most 85 ml/$m^2$, more preferably at least 50 ml/$m^2$ and at most 75 ml/$m^2$. In another embodiment of the present invention, the first solution is regenerated by a replenishing solution having the same composition as the starting first solution or having a composition with a higher concentration of the active components as present in the starting first solution. In another embodiment, the first solution is regenerated by a mixture of replenishing solutions. Such a mixture of replenishing solutions may comprise at least one solution wherein only one or two or three active components of the starting first solution composition is (are) present, optionally in a different concentration than present in the starting first solution, the other solution or solutions of the mixture may comprise another active component or components than present in the first replenishing solution, optionally in a different concentration than present in the starting first solution. When a mixture of replenishing solutions is used, one of the replenishing solutions may be water. In a more preferred embodiment, the first solution is regenerated by adding water.

In accordance with another highly preferred embodiment, a lithographic printing plate is made by the method as defined above wherein the first and second solutions are a gum solution whereby the plate is developed and gummed in a single step, and wherein the second solution is regenerated with a gum solution having the same composition as the starting gum solution of the first and second solution, optionally wherein the first solution is regenerated with water.

In accordance with a preferred embodiment of the present invention, the processor may also comprise a configuration of guide rollers and brushing rollers as defined in the automatic developing apparatus of EP 2 221 670 A2.

Drying

According to another embodiment of the present invention, the plate can be dried after the processing step in a drying unit. In a preferred embodiment the plate is dried by heating the plate in the drying unit which may contain at least one heating element selected from an IR-lamp, an UV-lamp, a heated metal roller or heated air. In a preferred embodiment of the present invention, the plate is dried with heated air as known in the drying section of a classical developing machine.

Baking

According to another embodiment of the present invention, the plate can be heated in a baking unit, optionally after drying the plate. In a preferred embodiment of the present invention, when the plate is heated in a baking unit, the precursor is developed by using a baking gum and the gum solution is preferably replenished by adding a replenishing baking gum. Said replenishing baking gum is a solution which may be selected from a starting baking gum, i.e. a solution having the same composition as the baking gum used at the start of the development, a concentrated baking gum or a diluted baking gum, i.e. a solution having a higher respectively lower concentration of additives than the starting baking gum, and water.

The baking unit may contain at least one heating element selected from an IR-lamp, an UV-lamp, a heated metal roller or heated air. The plate is preferably heated in the baking unit at a temperature above 110° C. and less than the decomposition temperature of the coating, more preferably between 200° C. and 295° C., most preferably between 250° C. and 290° C. A longer heating time is usually used when a lower heating temperature is used, and a shorter heating time is used when a higher heating temperature is used. The plate is preferably heated over a time period of less than 10 minutes, more preferably less than 5 minutes, most preferably less than 2 minutes.

In a preferred embodiment of the present invention, the plate is heated by the method as described in EP-A 1 506 854. In another preferred embodiment of the present invention, the plate is heated by the method as described in WO 2005/015318.

In another embodiment of the present invention, the drying step and the heating step may be combined in one single step wherein the plate, after the developing step, is dried and heated in an integrated drying-baking station.

Single Apparatus

According to another embodiment of the present invention, the first developing bath and the second developing bath are coupled together by mechanically plate conveyor. The first developing bath may be further coupled by mechanically plate conveyor to the preheating unit if a preheating step is needed. The second developing bath may be further coupled by mechanically plate conveyor to the drying unit. Optionally, when the plates are gummed before drying, the second developing bath may be coupled by mechanically plate conveyor to a rinsing unit if present and further to a gumming unit; the gumming unit is then further coupled to the drying unit. The drying unit may be further coupled by mechanically plate conveyor to the baking unit. The second developing bath or a gumming unit, if present, may also be further coupled by mechanically plate conveyor to the integrated drying-baking unit.

According to still another preferred embodiment of the present invention, said preheating unit, coupled to said first developing bath, may be further coupled to said platesetter by mechanical plate conveyor wherein the precursor is shielded from ambient light.

EXAMPLES

The printing plate precursor used in the INVENTION EXAMPLE 1 and the COMPARATIVE EXAMPLE 1 was :N94-VCF, a violet sensitive printing plate commercially available from AGFA, and the processing solution used in these two experiments was Violet CF Gum-NP, commercially available from AGFA.

In INVENTION EXAMPLE 1, 1600 $m^2$ of unexposed precursor :N94-VCF was developed in a processor P-1 wherein the plates were firstly processed with 6.2 l of solution Violet CF Gum-NP, present in a first developing bath, and, consecutively, with 7.0 l of solution Violet CF Gum-NP present in the second developing bath. The two developing baths of the processor P-1 were connected with each other in a cascade system wherein the second gum solution overflowed into the first developing bath, and this first bath was connected with a tank wherein the excess of used gum solution overflowed to be treated as waste. The second gum solution was regenerated by adding the same Violet CF Gum-NP solution at a rate of 50 ml/m² processed plate precursor. Each of the first and second bath were provided with a pump and a set of pipes to circulate respectively each of the first and second gum solutions and to conduct each of the first and second gum-solution onto a spray-bar. This spray-bar is provided with nozzles and present over total width of the processor to wet the coated side of the precursor. The processing width of the processor has a value of 0.95 m. Above each of the first and second developing bath, beside the spray-bar, two brush rollers were present to brush the coating side of the precursor to enhance the processing of the plates. The temperature of the gum solutions was maintained at 22° C. and the development speed amounted to 1.2 m/min. During processing, the soluble parts of the coating were removed from the support and the concentration of this material cumulated in the first developing solution was determined each time after processing of 25 m² precursor. Due to the presence of blue coloured components (note that the plate precursor comprises Heliogene Blue which is a phthalocyanine dye commercially available from BASF) in the removed coating layer, the concentration of these components was determined by measuring the cyan absorption (measured with a Gretag D129C densitometer) of the dried 10 μl spot on a filter paper of the gum. The filter paper used was Macherey-Nagel, MN1670, Duren, Germany. This cyan absorption is also a good measure for the total concentration of removed material. Note that when other printing plate precursors are used, having another colorant than phthalocyanine, the concentration of removed layer can be measured at another wavelength or wavelength range, for example at the wavelength or wavelength range that best matches with this absorption maximum of the colorant or the main absorption range of the colorant.

In COMPARATIVE EXAMPLE 1, this processing experiment as described above for Invention Example 1 was repeated with processor P-2 which had the same configuration as P-1, but with the exception that 60 l of Violet CF Gum-NP was provided in the first bath instead of 6.2 l.

The results of Invention Example 1 demonstrate that, after processing of about 1300 m² printing plate precursor :N94-VCF, the developing solution reaches a constant value of 0.48 for the cyan absorption, while in the Comparative Example 1 the cyan absorption after processing of the same amount of precursor was about 0.15 which was still increasing when processing a higher number of printing plate precursors. This constant value of the cyan absorption indicates that also a constant level of concentration of removed material in the solution is reached, resulting in a constant level of activity of the developing solution. The still increasing value of the cyan absorption indicates that the concentration of removed material in the solution is still increasing and no constant level of activity of the developing solution is reached after processing of about 1300 m² printing plate precursor.

The invention claimed is:

1. A method of making a lithographic printing plate, the method comprising the steps of:
    image-wise exposing a lithographic printing plate precursor including a support including a hydrophilic surface or a hydrophilic layer and, a light or heat sensitive coating including a photopolymerisable composition containing a polymerisable compound, that is polymerisable by exposure to light or heat, on the support;
    processing the precursor, consecutively, with a first solution and a second solution to remove the coating from the support at non-printing areas;
    the first and second solutions are provided by a cascade system such that the second solution overflows into the first solution and the first solution overflows into a container to be treated as waste;
    the second solution is regenerated by adding a replenishing solution or a mixture of replenishing solutions at a rate of at least 5 ml/m² of treated precursor and at most 100 ml/m² of treated precursor;
    the first and second solutions are circulated respectively by a first and second liquid conveying system;
    the first solution in the first liquid conveying system has a volume of at least Vmin and at most Vmax, respectively, defined by formula 1 and formula 2:

$$V\text{min}=[A+(\text{processing width}/0.95\text{ m})]\cdot\text{liter} \quad \text{(formula 1)}$$

$$V\text{max}=[B+(\text{processing width}/0.95\text{ m})]\cdot\text{liter} \quad \text{(formula 2)}$$

Vmin and Vmax represent, respectively, a minimum and a maximum volume in the first liquid conveying system, each expressed in liters;
    A represents a constant value of 2 and B represents a constant value of 15, 10, 8, or 6; and
    the processing width represents a width, expressed in m, inside a processing unit, perpendicular to a processing direction of the precursor.

2. The method according to claim 1, wherein the second solution is regenerated by adding a replenishing solution or a mixture of replenishing solutions at a rate of at least 20 ml/m² of treated precursor and at most 85 ml/m² of treated precursor.

3. The method according to claim 1, wherein the second solution is regenerated by adding a replenishing solution or a mixture of replenishing solutions at a rate of at least 50 ml/m² of treated precursor and at most 75 ml/m² of treated precursor.

4. The method according to claim 1, wherein the second solution in the second liquid conveying system has a volume of at least Vmin and at most Vmax, respectively, defined by formula 3 and formula 4:

$$V\text{min}=[A'+(\text{processing width}/0.95\text{ m})]\cdot\text{liter} \quad \text{(formula 3)}$$

$$V\text{max}=[B'+(\text{processing width}/0.95\text{ m})]\cdot\text{liter} \quad \text{(formula 4)}$$

Vmin and Vmax represent, respectively, a minimum and a maximum volume in the second liquid conveying system, each expressed in liters;
    A' and B' represent a constant value of respectively 2 and 15;
    the processing width represents a width, expressed in m, inside the processing unit, perpendicular to the processing direction.

5. The method according to claim 1, wherein a volume of the second solution in the second liquid conveying system is a same as the volume of the first solution present in the first liquid conveying system.

6. The method according to claim 1, wherein the first solution is regenerated by adding a replenishing solution or a mixture of replenishing solutions or water.

7. The method according to claim 1, wherein the first and second solutions are a gum solution such that the precursor is developed and gummed in one single step.

8. The method according to claim 7, wherein the second solution is regenerated by adding fresh gum solution.

9. The method according to claim 1, wherein the light or heat sensitive coating on the support includes an image recording layer and, optionally, a top layer on top of the light or heat sensitive coating.

10. The method according to claim 9, wherein the light or heat sensitive coating on the support includes an intermediate layer between the support and the image recording layer.

* * * * *